United States Patent [19]
Stuart et al.

[11] Patent Number: 5,235,501
[45] Date of Patent: Aug. 10, 1993

[54] HIGH EFFICIENCY VOLTAGE CONVERTER

[75] Inventors: Thomas A. Stuart, Maumee, Ohio; Keming Chen, Clifton Park, N.Y.

[73] Assignee: The University of Toledo, Toledo, Ohio

[21] Appl. No.: 733,168

[22] Filed: Jul. 19, 1991

[51] Int. Cl.[5] .......................................... H02M 3/335
[52] U.S. Cl. .................................... 363/17; 363/98; 363/132
[58] Field of Search ............... 363/17, 98, 26, 132, 363/136, 58

[56] References Cited

U.S. PATENT DOCUMENTS

| | | | |
|---|---|---|---|
| 4,864,483 | 9/1989 | Divan | 363/37 |
| 4,953,068 | 8/1990 | Henze | 363/17 |
| 4,965,710 | 10/1990 | Pelly et al. | 363/56 |
| 5,077,651 | 12/1991 | Kobayashi et al. | 363/56 |
| 5,132,888 | 7/1992 | Lo et al. | 363/17 |
| 5,140,510 | 8/1992 | Myers | 363/20 |

OTHER PUBLICATIONS

"A DC to DC PWM Series Resonant Converter Operated at Resonant Frequency", Vandelac et al., Aug. 1988, IEEE Transactions on Industrial Electronics, vol. 35, No. 3, p. 456.

"Constant Frequency Clamped-Mode Resonant Converters", Lee et al., Oct. 1988, IEEE Transactions on Industrial Electronics, vol. 3, No. 4, p. 460.

*Primary Examiner*—Steven L. Stephan
*Assistant Examiner*—B. Davidson
*Attorney, Agent, or Firm*—Marshall & Melhorn

[57] ABSTRACT

A full bridge DC to DC converter which provides zero voltage switching (ZVS) for one leg of the bridge and zero current switching (ZCS) for the other leg of the bridge is described. ZVS is achieved with parallel capacitors, while ZCS is achieved by using the reverse breakdown characteristics of the various diode and switching devices. This technique provides a significant reduction in the switching losses of the switching devices, which allows for higher power and frequency combinations.

20 Claims, 7 Drawing Sheets

A ZVS/ZCS IGBT CONVERTER WHICH TRANSFERS
ENERGY STORED IN L1 TO C2 AND C4

A ZVS/ZCS IGBT CONVERTER WHICH TRANSFERS ENERGY STORED IN L1 TO C2 AND C4

$L_l$ = LEAKAGE INDUCTANCE OF T1
S1, S3 = SCHOTTKY OR ZENER DIODES

TIMING DIAGRAM

Q1,Q3 CONNECTION WHICH ALLOWS
C2,C4 DISCHARGE INTO $V_S$

Q2 AND Q4 WITH ACTIVE VOLTAGE CLAMP CIRCUITS

A ZVS/ZCS IGBT CONVERTER USING THE REVERSE BREAKDOWN OF Z2 AND Z4

$L_l$ = LEAKAGE INDUCTANCE OF T1
REVERSE AVALANCHE VOLTAGE (RAV) OF Z2 AND Z4 < RAV OF Q2 AND Q4

ZVS/ZCS CONVERTER WITHOUT DIODES $L_l$ = LEAKAGE INDUCTANCE OF T1

HIGH EFFICIENCY VOLTAGE CONVERTER

BACKGROUND OF THE INVENTION

This invention relates to an electrical converter circuit for converting direct current from one level to another. The circuit includes current and voltage switching means in the primary circuit, and a rectifier means in the secondary circuit.

Prior art Pulse Width Modulation (PWM) circuits have significant power losses in the switching devices. These losses may occur when the devices turn on, (turn-on loss) when they turn off, (turn-off loss) and while they conduct current (conduction loss). These losses cause heating in the switching devices, which ultimately limits the amount of power that can be processed by the converter and/or limits the maximum temperature for its environment. The turn on and turn off losses (switching losses) also increase with the switching frequency, and thus they limit the maximum frequency. This limitation is important because higher frequencies allow the use of smaller transformer and filter components, which reduces the size, weight, and cost of the converter. At power levels above several kilowatts, these restrictions usually dominate the design, making it necessary to use parallel arrays of the devices and/or use more elaborate cooling methods. Both of these approaches often result in dramatic increases in complexity, size, and cost of the converter.

Thus, the use of desirably high frequencies is in effect limited by the switching losses. Heretofore, the two most popular technologies of operating the switching devices at the highest possible frequency that still provides high efficiency (losses increase with frequency) are as follows:

1. Use FET (field effect transistors) for the switching devices at frequencies above 100 kHz. These devices are the fastest available type of switch, but their power ratings are much lower than the other alternative IGBTs (Insulated Gate Bipolar Transistors). This is especially true whenever $V_{IN} \geq 200$ Vdc. This means that several FETs must be used in parallel to achieve a high power level. The resulting design will be lightweight, but very expensive.

2. Use IGBTs for the switching devices at a frequency of up to 20 kHz. IGBTs have much higher power ratings than FETs, and therefore an IGBT converter will be much cheaper. However, IGBTs have a slow turn-off characteristic, referred to as "tailing", which limits their operation to frequencies below 20 kHz. Therefore the resulting design will necessarily include a much larger and heavier transformer than an FET circuit.

There is thus a need for a small, lightweight, and cost effective DC to DC converter that can operate at high power and high frequency.

SUMMARY OF THE INVENTION

According to the present invention there is provided a full bridge converter for converting direct current from one level to another. Such converter uses zero voltage switching for one leg of the bridge and zero current switching for the other leg of the bridge.

According to one embodiment, the converter comprises an inverter means including first and second switching means, a transformer means, an inductance means, a rectifier means, means for regulating the DC output of the rectifier means and for applying that regulated output to a load, and means for modulating the length of the alternating conduction period of the switching means. Each switching means is provided with a set of two switching devices, for example, insulated gate bipolar transistors, which sequentially operate in opposed pairs. This induces an alternating current in the input winding of the transformer which changes the current to a new level in its output winding. This induced alternating current is then converted back to direct current by the rectifier means, filtered, and then applied to an external load. Regulation of the output voltage is achieved by modulating the conduction periods of two of the switching devices, which is accomplished by using a feedback control circuit.

The advantages of this converter over conventional circuits can be summarized as follows:

Q1 and Q3 have almost no turn off loss, which at higher frequencies is usually the largest of the three types of losses. As a result, Q1 and Q3 have a much lower temperature rise. These former Q1 and Q3 energy losses are either recovered or dissipated in other components to decrease the temperature rise of Q1 and Q3.

Since the currents in Q1 and Q3 are zero before they turn off, they turn off much faster. This allows higher switching frequencies.

The turn off losses of Q2 and Q4 are greatly reduced, and they have virtually no turn on losses at higher loads. This reduces their temperature rise to a level that is comparable to the temperature of Q1 and Q3.

This converter is particularly useful when the following types of devices are used for the switching devices:
Insulated Gate Bipolar Transistors (IGBT)
Bipolar Junction Transistors (BJT)
Metal Oxide Semiconductor Controlled Thyristors (MCT)

However, the Zero Voltage Switching/Zero Current Switching operation should be functional with any type of switching device.

An object of this invention is to have virtually no turn off losses for the switching devices on one leg of the bridge. A further object of this invention is to have virtually no turn on losses for the switching devices on the other leg of the bridge. This will allow for higher switching frequencies which in turn will allow the use of smaller transformer and filter components, which ultimately will reduce the size, weight, and cost of the converter.

For further understanding of the present invention and the objects thereof, attention is directed to the drawings and the following brief description thereof, to the detailed description of the preferred embodiments, and to the appended claims.

DETAILED DESCRIPTION OF THE INVENTION

This invention provides a significant reduction in the switching losses in the following manner. All explanations will be based on the half cycle during which Q1 and Q4 conduct. On a typical half cycle, Q1 and Q4 will turn on at the same time, but Q4 will turn off first (refer to FIG. 2). Thus Q2 and Q4 form the leading leg of the bridge and Q1 and Q3 form the trailing leg. When Q4 turns off, capacitors C2 and C4 decrease the rate at which the voltage across Q4 can increase. Thus Q4 turns off at almost zero voltage, and this greatly reduces its turn off loss. This process is called zero voltage switching (ZVS). After Q4 turns off, Q1 continues to conduct and C2 and C4 continue to charge. $I_0$ is almost constant, and as long as $V_{c4} < V_8$, $I_0$ continues to flow through the secondary of T1, which also holds $I_0$ almost constant ($I_0$ remains almost constant because of the large value of $L_0$). When $V_{c4} \geq V_8$, $I_0$ will flow through D5–D7 and D6–D8 instead of the secondary. $I_1$ will now start to decrease, but $V_{c4}$ will continue to charge to a value above $V_8$ because of the energy stored in the leakage inductance, L, and $I_1$ will start to decrease. $I_1$ can now be driven to zero before Q1 turns off, using any one of the three methods described below. This process is called zero current switching (ZCS) because Q1 turns off after $I_1 = 0$.

METHOD 1

Figure 1:
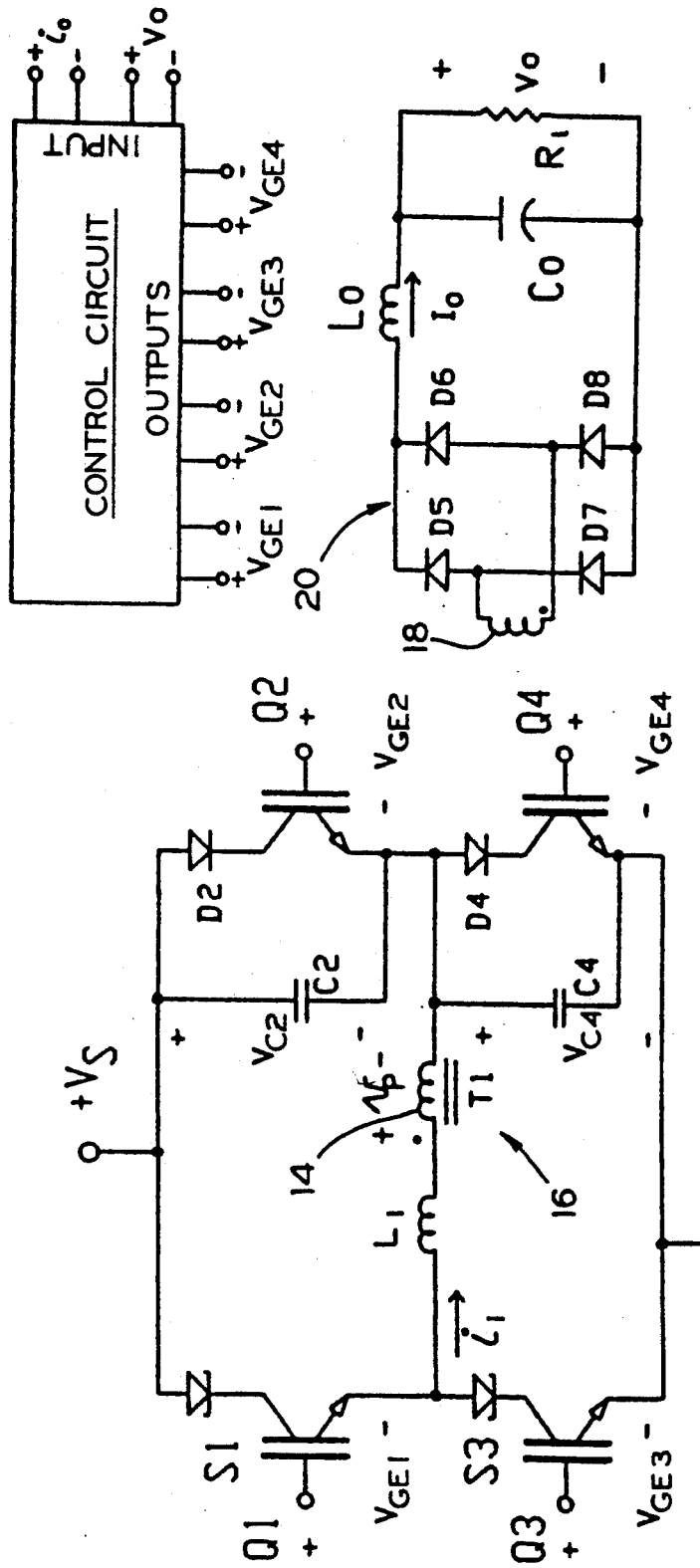
FIG. 1 is a schematic diagram of one embodiment of an electrical converter incorporating the teachings of the present invention.

When Q4 turns off in FIG. 1, all of the energy stored in L1 will be transferred to C2 and C4. This energy is then used by the load on the next half cycle.

This approach minimizes the energy loss, but $V_{c4}$ may be so high as to require excessive voltage ratings for Q1–Q4. Naturally, this is especially true for higher values of $L_1$ and/or $I_1$. Note that D2 is used to prevent reverse breakdown of Q2, in which case $I_1$ would circulate in the Q1–Q2 loop, and some of the energy would be dissipated by Q2. If IGBTs with higher reverse breakdown voltages were used, S1, S3, D2 and D4 would be unnecessary as in FIG. 7. However, as shown in FIGS. 1, 4–7, all devices in the Q1 and Q3 legs must be capable of withstanding reverse voltage avalanche. This is because Q1 and Q3 may experience forced commutation under light loading conditions, and controlled avalanche is necessary to limit the resulting voltage transients.

Figure 3:
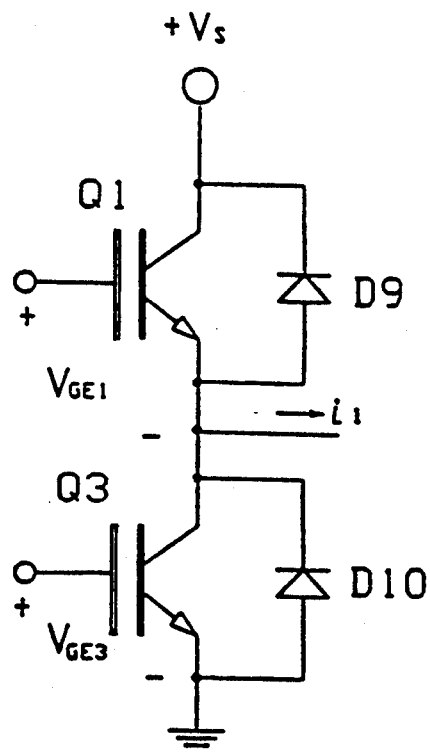
FIG. 3 is a schematic diagram of one leg of an alternate embodiment of the invention.

In some cases it is acceptable to allow C2 and C4 to discharge back into $V_8$. If so, Q1, Q3, S1 and S3 are replaced by the circuit in FIG. 3. The advantages of FIG. 3 are the lower collector-emitter voltages of Q1 and Q3 and the absence of the S1, S3 losses. Q1 and Q3 may have higher turn-on losses, however, since the diode recovery current will add to the IGBT turn-on current.

METHOD 2

Figure 4:
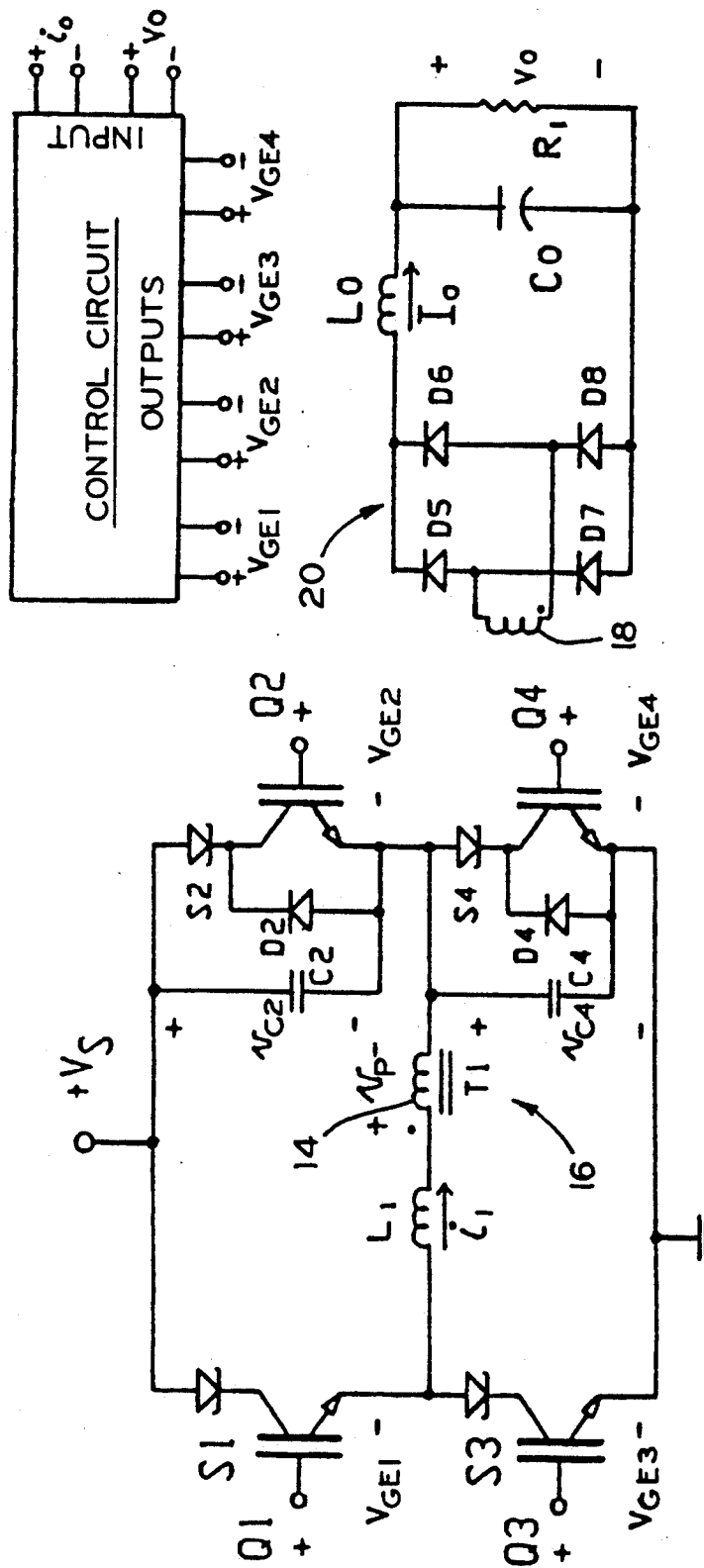
FIG. 4 is a schematic diagram of an alternate embodiment of the invention.

The preferred configuration for this method is shown in FIG. 4. If $V_{c4}$ exceeds $V_8$ plus the breakdown voltage of S2, part of the energy stored in $L_1$ will be transferred to C2 and C4, and the rest will be dissipated by S2 until $I_1 = 0$. This approach limits the Q1–Q4 voltage ratings, but the S2 and S4 dissipation may be significant. D2 and D4 prevent Q2 and Q4 breakdown and the associated heating of these devices. If Q2–Q4 breakdown is acceptable, the circuit in FIG. 1 can be used if Schottkys or Zeners are used in place of D2 and D4.

As in Method 1, the replacement circuit in FIG. 3 can be used if C2 and C4 discharge into $V_8$ is acceptable.

METHOD 3

Figure 5:
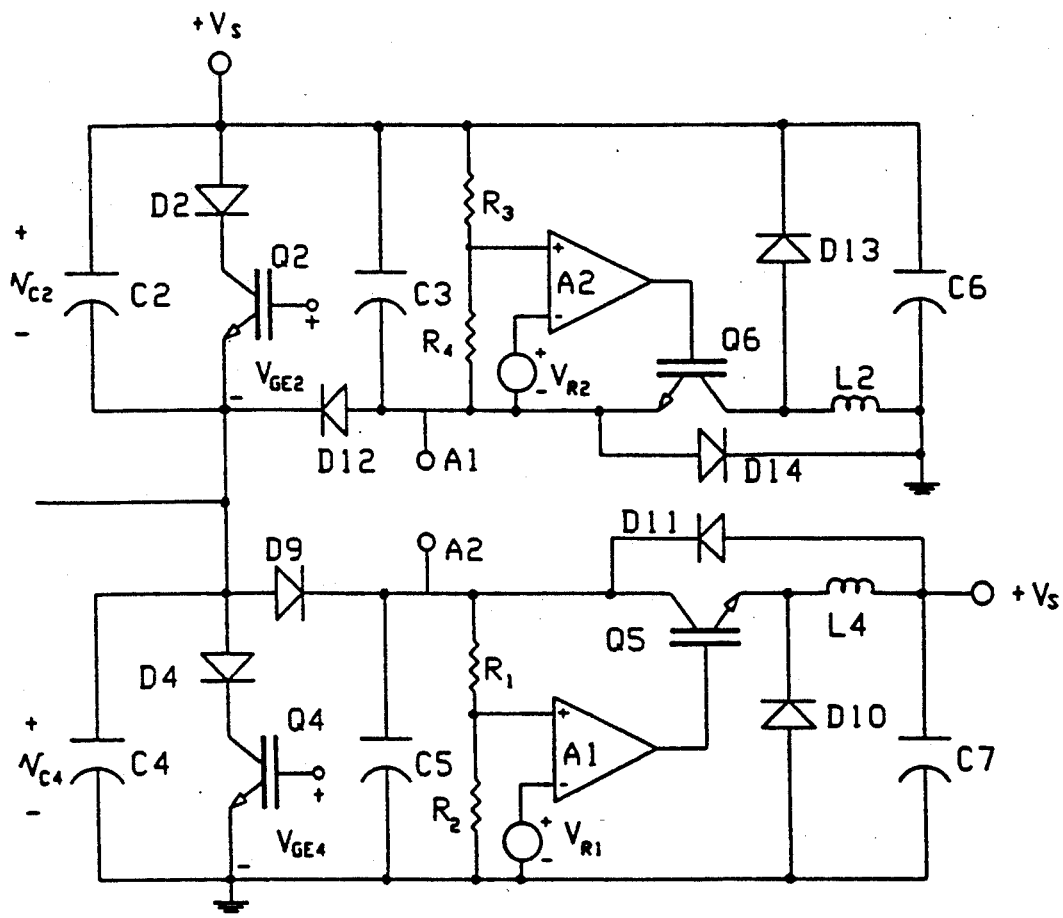
FIG. 5 is a schematic diagram of another alternate embodiment of the invention.

Instead of storing all the energy in C2 and C4 as in method 1 or exceeding the breakdown of S2 as in method 2, $V_{c4}$ also can be limited by an active clamp circuit as shown in FIG. 5. $V_{c4}$ is limited by the circuitry associated with Q5, while $V_{C2}$ is limited by the circuitry associated with Q6. Q5–6 can be much smaller than Q1–4. These circuits are similar to the common step-down switching regulator which is controlled by PWM. However, in this case the input voltage, $V_{c4}$, is regulated instead of the output, which is connected to $V_8$. Assuming $V_{c4} > V_8$, $V_{c4}$ monitored by the R1–R2 attenuator and compared to the $V_{R1}$ reference. If $V_{C4}$ charges to the desired regulation level, Q5 is activated to transfer the excessive energy to C7, where it can be reused. This circuit avoids the losses associated with the S2 breakdown in FIG. 4, and excessive values of $V_{C4}$ in FIG. 1. Note the necessity of having $V_{c4} > V_8$ in order to drive I to zero after Q4 turn off. Since $V_{c4} < V_8$ at smaller loads, D11 is required to keep C5 charged to $V_8$ and prevent excessive Q2 turn on current into C5. Note that $C_5 > > C_4$.

Figure 7:
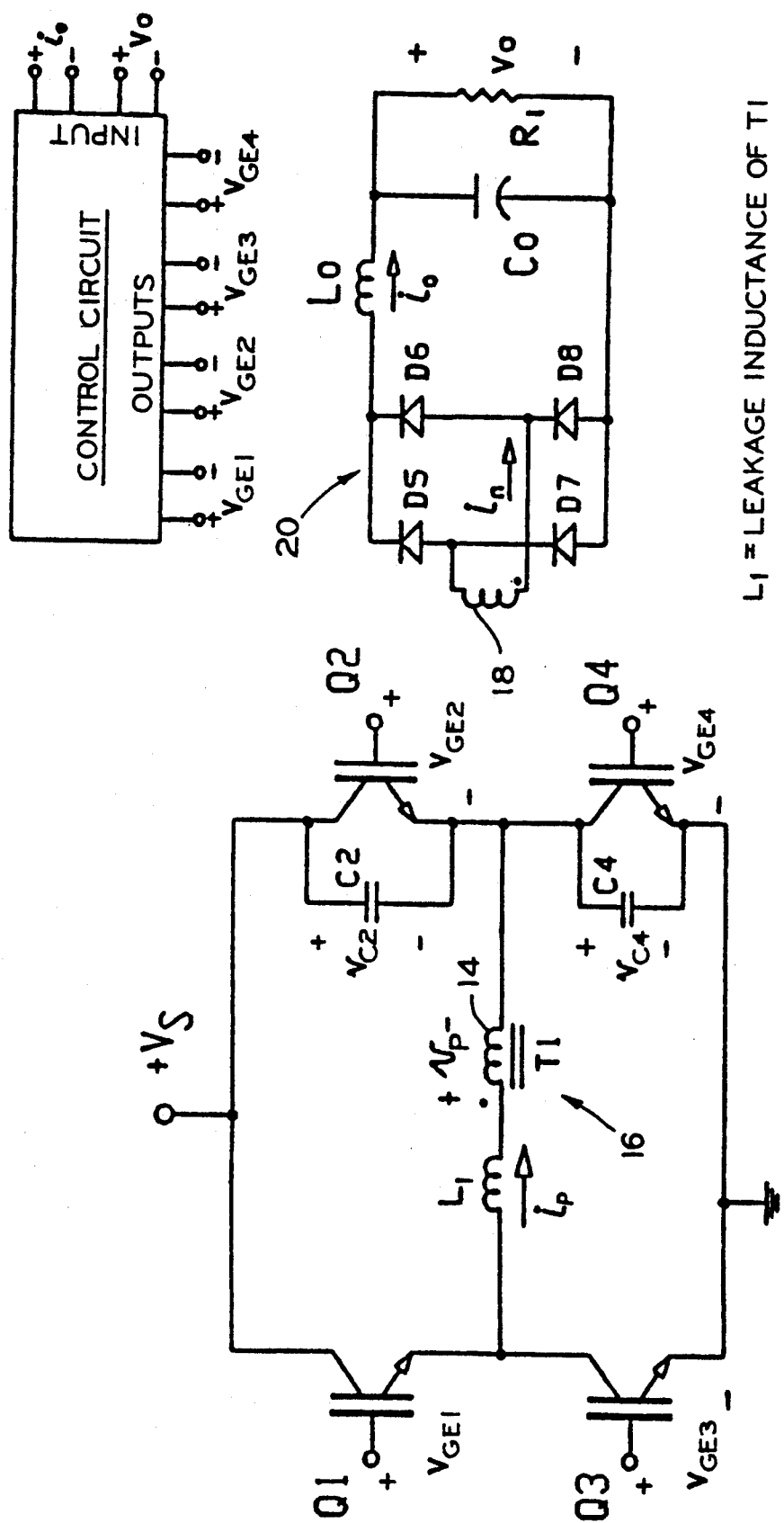
FIG. 7 is a schematic diagram of still another alternate embodiment of the invention.

As in method 1, S1, S3, D2 and D4 can be avoided as in FIG. 7, if Q1–Q4 have adequate reverse breakdown voltages. The replacement circuit in FIG. 3 can be used if C2 and C4 discharge into $V_8$ is acceptable.

Figure 8:
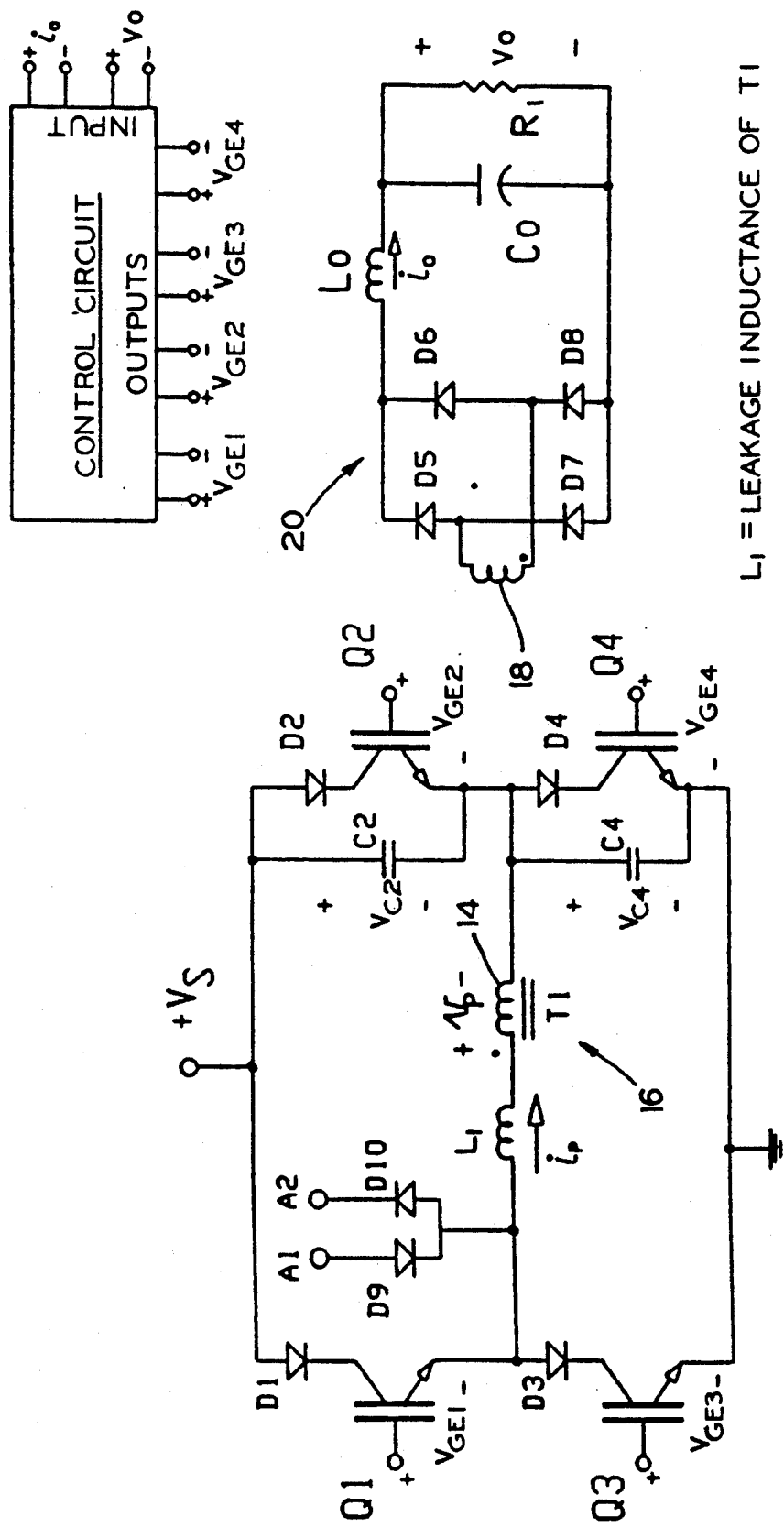
FIG. 8 is a schematic diagram of still another alternate embodiment of the invention.

The voltage clamp in FIG. 5 also can be used with the converter in FIG. 8 to provide an active clamp for Q1 and Q3 in addition to Q2 and Q4. This avoids the need for high voltage zener or Schottky diodes without the reverse recovery losses associated with reverse parallel diodes.

On the next half cycle Q2 and Q3 turn on simultaneously. This half cycle then proceeds with Q2 acting in the same manner as Q4 and Q3 acting the same as Q1.

Figure 6:
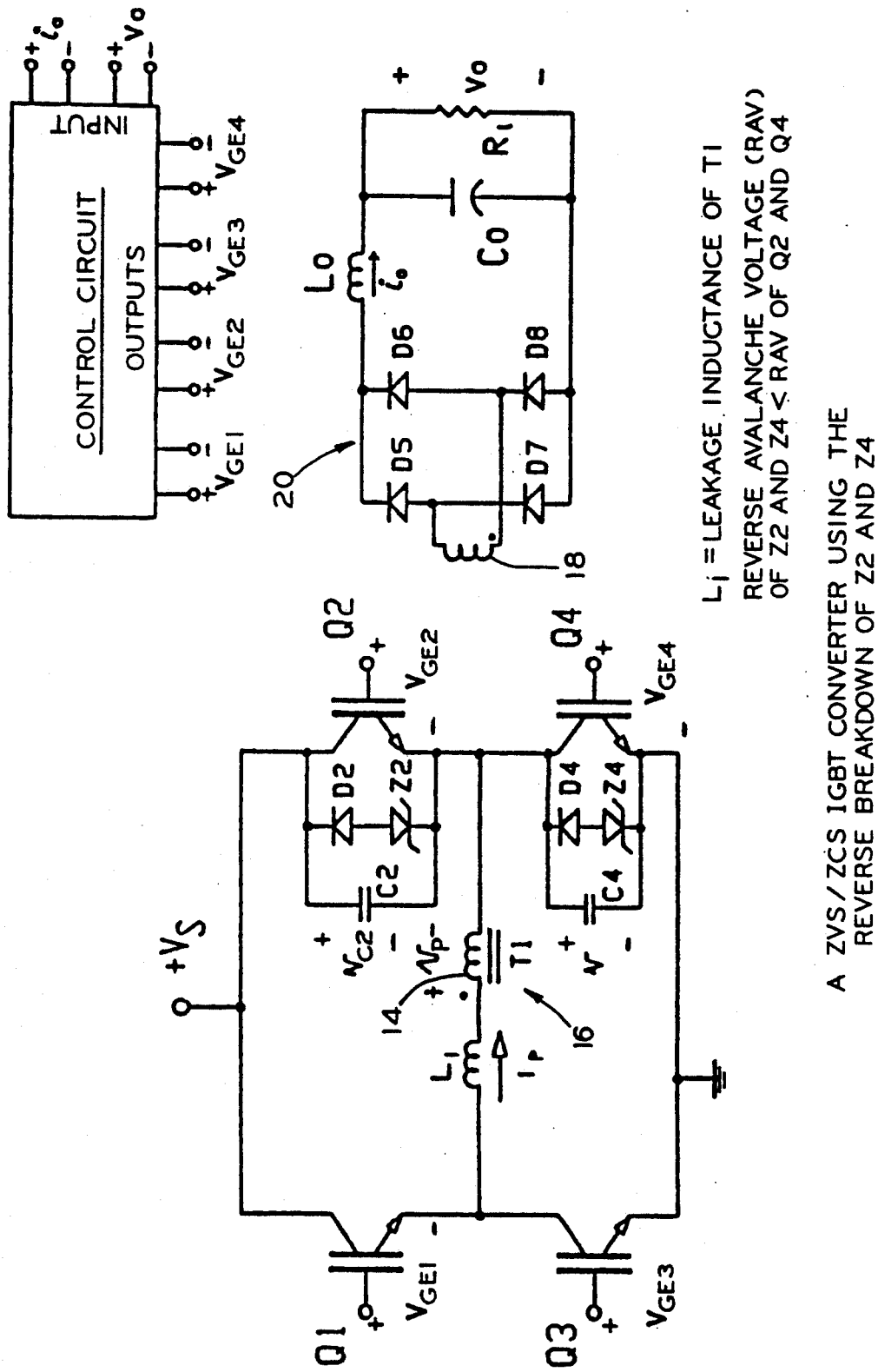
FIG. 6 is a schematic diagram of yet another alternate embodiment of the invention.

There are also a variety of other ways of achieving ZCS by method 2. In FIG. 6, ZCS is achieved by using breakdown diodes, such as Zeners Z2 and Z4 in parallel with Q2 and Q4. This has the advantage of avoiding the forward voltage drop of S2 and S4, but the diode breakdown voltages must be less than the reverse breakdown voltages of Q2 and Q4.

Another possibility for method 2 is shown in FIG. 7 where ZCS is achieved by simply exceeding the reverse breakdown voltage of Q2 and Q4. This avoids the use of breakdown diodes, but it has the disadvantage of increasing the dissipation in Q2 and Q4. However, this has proven to be effective for some applications. It can only be used with devices such as IGBT's or MCT's that have a large controlled reverse breakdown voltage.

Figure 2:
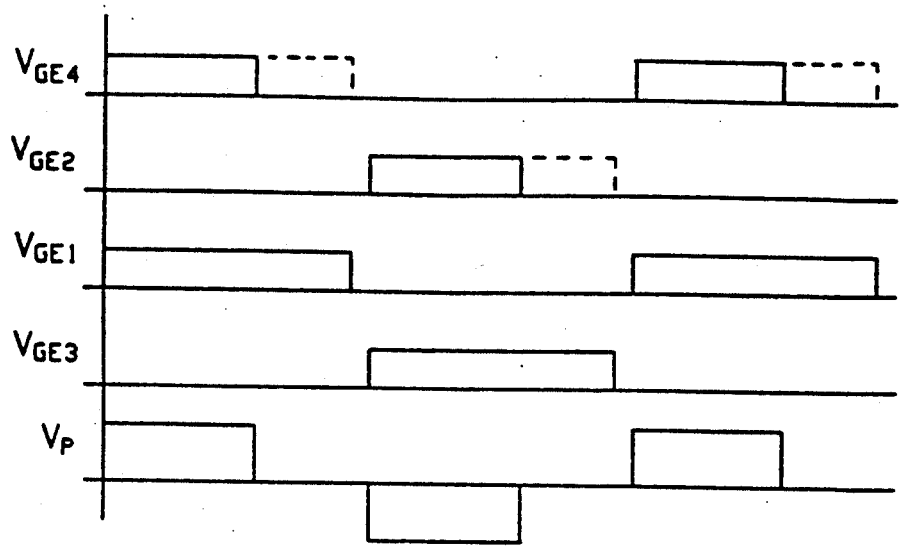
FIG. 2 is a timing diagram of various waveforms that are present in an electrical converter incorporating the teachings of the present invention.

Another important feature is the variable gap between the drive signals for Q2 and Q4 (indicated by dashed lines in FIG. 2). A conventional control system, referred to as phase shift control, has a very small fixed gap between the Q2 and Q4 drive signals. At light load, the variable gap increases and allows additional time to charge C2 and C4 before Q2 turns on. This helps Q2 to avoid the current surge associated with turning on into a partially charged capacitor. This allows the use of larger C2 and C4 values, which further decreases the turn off losses of Q2 and Q4. Since Q1 and Q3 turn off very rapidly, the gap between their drive signals in FIG. 2 can be made extremely small. This increases the conduction time which results in better component utilization. One final advantage is the fact that if $V_{c4} > V_8$, as in FIGS. 1, 4, 6 and 7, a slight current flows in the reverse direction through Q1 after its forward current has decreased to zero. This helps to remove any stored charge from Q1. In a conventional circuit, when Q3 turns on to start the next half cycle, a current transient normally flows through Q1 and Q3 due to the remaining store charge Q1. If reverse current is allowed to flow through Q1, this transient is much lower with the ZVS/ZCS converter because of the lower stored charge.

The directional switching flow of current through the primary winding 14 of the transformer 16 acts as an alternating current which will induce a directional switching flow of current through a secondary winding 18 of the transformer 16 at a different voltage than the voltage of the current flow through the primary winding 14. Thus, the voltage in the secondary winding 18 is equal to the voltage in the primary winding 14 multiplied by the ratio of the number of turns in the secondary winding 18 to the number of turns in the primary winding 14, as is understood in the art. The output of the secondary winding 18 of the transformer 16 is rectified to a direct current by a rectifier bridge 20. The rectifier bridge has diodes D5 and D7, with a connection to the secondary winding 18 between the diodes D5 and D7, and it further has diodes D6 and D8, with a second connection to the secondary winding 18 to provide a direct current. This direct current is then filtered by inductor L0 and capacitor C0 before it is applied to the external load R1.

Although the best mode contemplated by the inventor for carrying out the present invention as of the filing date hereof has been shown and described herein, it will be apparent to those skilled in the art that suitable modifications, variations, and equivalence may be made without departing from the scope of the invention, such scope being limited solely by the terms of the following claims.

What is claimed is:

1. A DC-DC voltage converter comprising:
   a voltage source;
   inverter means connected to said voltage source, said inverter means including a first, second, third, and fourth switching means;
   transformer means connected to said inverter means, said transformer means including a primary winding and a secondary winding;
   rectifier means connected to the secondary winding of said transformer means for supplying a DC output voltage;
   capacitance means connected to said inverter, said capacitance mans including a second capacitor in parallel across the second switching means and a fourth capacitor in parallel across the fourth switching means; and
   control means for regulating the output voltage, said control means supplying fixed pulse width control signals to the first and third switching means and pulse width modulation control signals to the second and fourth switching means in an operating cycle in which (1) the first and the fourth switching means are turned on while the second and the third switching means remain off, (2) the fourth switching means in turned off such that the voltage rise across the fourth switching means is limited by said capacitor means to facilitate zero voltage switching of the fourth switching means, (3) the fourth capacitor is charged to a voltage greater than the voltage source such that a current through the primary winding is driven to zero, (4) the first switching means is turned off after the current through the primary winding reaches zero to facilitate zero current switching of the first switching means, (5) the second and the third switching means are turned on while the first and the fourth switching means remain off, (6) the second switching means is turned off such that the voltage rise across the second switching means is limited by said capacitor means to facilitate zero voltage switching of the second switching means, (7) the second capacitor is charged to a voltage greater than the voltage source such that the current through the primary winding is driven to zero, and (8) the third switching means is turned off after the current through the primary winding reaches zero to facilitate zero current switching of the third switching means.

2. The voltage converter defined in claim 1 wherein said control means includes an operating cycle during which a current flows through the first switch means and the third switch means in a reverse direction after a forward current through the primary winding has decreased to zero, whereby a stored charge is removed from the first switching means the third switching means is turned on, and a stored charge is removed from the third switching when the first switching means is turned on, which reduces a current transients through the first and third switching means.

3. The voltage converter defined in claim 1 wherein the second and fourth switching means of said inverter means are connected in series to form a leading leg, the first and third switching means of said inverter means are connected in series to form a trailing leg, the leading leg and trailing leg are connected in parallel, said transformer means is connected in series between the junction of the first and third switching means and the junction of the second and fourth switching means, and a DC voltage source connected in parallel with the leading leg and the tailing leg.

4. The voltage converter defined in claim 1 wherein the pulse width modulation signal from said control means includes an adjustable time interval between signals to the fourth switching means and the second switching means of said inverter means whereby the time interval is increased as the load decreases to allow additional time to charge the second and fourth capacitors, which decreases the switching losses of the second and fourth switching means.

5. The voltage converter defined in claim 1 wherein the period of time in the on state for the fourth and second switching means is less than the period of time in the one state for the first and third switching means, respectively, whereby energy stored in the primary winding of said transformer is transferred to said capacitance means to facilitate zero current switching of the first and third switching means.

6. The voltage converter defined in claim 1 wherein the first and third switching means include a large controlled reverse voltage avalanche which limits the resulting voltage transients when the first and third switching means experience forced commutation under light loading conditions.

7. The voltage converter defined in claim 1 wherein the first, second, third, and fourth switching means include insulated gate bipolar transistors.

8. The voltage converter defined in claim 1 wherein the first, second, third, and fourth switching means include bipolar junction transistors.

9. The voltage converter defined in claim 1 wherein the first, second, third, and fourth switching means include metal oxide semiconductor controlled thyristors.

10. The voltage converter defined in claim 1 wherein a first, second, third, and fourth diode means are coupled in series to the first, second, third, and fourth switching means, respectively, whereby the diode means prevent reverse breakdown of said switching means.

11. The voltage converter defined in claim 1 wherein a first reverse parallel diode means and a third reverse parallel diode means are connected in reverse parallel across the first switching means and the third switching means, and a second and fourth diode means are coupled in series to the second and fourth switching means, respectively, whereby the second and fourth capacitors are permitted to discharge back into said voltage source.

12. The voltage converter defined in claim 10 wherein the first, second, third, and fourth diode means include controlled avalanche diodes.

13. The voltage converter defined in claim 12 wherein the controlled avalanche diodes include Schottky diodes.

14. The voltage converter defined in claim 12 wherein the controlled avalanche diodes include Zener diodes.

15. The voltage converter defined in claim 12 including a second reverse parallel diode connected in reverse parallel across the second switching means and a fourth reverse parallel diode connected in reverse parallel across the fourth switching means whereby the second switching means enters into reverse avalanche when the voltage across the second capacitor exceeds said source voltage plus the breakdown voltage of the second switching means, and the fourth switching means enters into reverse avalanche when the voltage across the second capacitor exceeds said source voltage plus the breakdown voltage of the second switching means.

16. The voltage converter defined in claim 1 including a second breakdown diode connected in parallel across the second switching means and a fourth breakdown diode connected in parallel across the fourth switching means.

17. The voltage converter defined in claim 1 wherein a first active clamp circuit is connected in parallel across the second switching means and a second active clamp circuit is connected in parallel across the fourth switching means of said inverter means such that energy is stored in the active clamp circuits to provide for zero current switching of the first and third switching means.

18. The voltage converter defined in claim 17 wherein the first and second active clamp circuits are also connected to the first and third switching means of said inverter means.

19. A DC-DC voltage converter comprising:
inverter means for receiving a DC input voltage, including a first, a second, a third, and a fourth insulated gate bipolar transistor, the second and fourth insulated gate bipolar transistors being connected in series to form a leading leg, the first and third insulated gate bipolar transistors being connected in series to form a trailing leg, and the leading leg and trailing leg being connected in parallel;
a DC voltage source connected in parallel to the leading leg and the trailing leg;
a first and second capacitor connected in parallel across the second and fourth insulated gate bipolar transistors, respectively;
a first, second, third, and fourth controlled avalanche diode connected in series to the first, second, third, and fourth insulated gate bipolar transistors, respectively;
transformer means connected between the junction of the first and third insulated gate bipolar transistors and the junction of the second and fourth insulated gate bipolar transistors, said transformer means including a primary winding and a secondary winding;
rectifier means connected to the secondary winding of said transformer means for converting an AC voltage of said transformer means into a DC output voltage; and
control means for supplying control signals to the first, second, third, and fourth insulated gate bipolar transistors to provide for zero voltage switching of the second and fourth insulated gate bipolar transistors and for zero current switching of the first and third insulated gate bipolar transistors, said control means generating a fixed pulse width signal to selectively energize the first and third insulated gate bipolar transistors to an on state and an off state and a pulse width modulation signal to selectively energize the second and fourth insulated gate bipolar transistors to an on state and an off state such that the first and fourth insulated gate bipolar transistors are selectively energized to an on state during a first half cycle of aid control means and the second and third insulated gate bipolar transistors are selectively energized to an on state during the second half cycle of said control means.

20. The voltage converter defined in claim 19 wherein said control means transmit signals for an operating cycle in which (1) the first and the fourth switching means are turned on while the second and the third switching means remain off, (2) the fourth switching means is turned off such that the voltage rise across the fourth switching means is limited by said capacitor means to facilitate zero voltage switching of the fourth switching means, (3) the fourth capacitor is charged to a voltage greater than the voltage source such that a current through the primary winding is driven to zero, (4) the first switching means is turned off after the current through the primary winding reaches zero to facilitate zero current switching of the first switching means, (5) the second and the third switching means are turned on while the first and the fourth switching means remain off, (6) the second switching means is turned off such that the voltage rise across the second switching means is limited by said capacitor means to facilitate zero voltage switching of the second switching means, (7) the second capacitor is charged to a voltage greater than the voltage source such that the current through the primary winding is driven to zero, and (8) the third switching means is turned off after the current through the primary winding reaches zero to facilitate zero current switching of the third switching means.

* * * * *

UNITED STATES PATENT AND TRADEMARK OFFICE
CERTIFICATE OF CORRECTION

PATENT NO. : 5,235,501
DATED : August 10, 1993
INVENTOR(S) : Thomas A. Stuart & Keming Chen It is certified that error appears in the above-indentified patent and that said Letters Patent is hereby corrected as shown below:

Column 3, lines 23, 26, 29, 56 and 66, "$V_8$" should read --$V_s$--.

Column 4, lines 8, 21, 27, 28, 29 and 35, "$V_8$" should read --$V_s$--; line 28, "I" should read --$I_1$--.

Column 5, line 7, "$V_8$" should read --$V_s$--.

Signed and Sealed this

Nineteenth Day of April, 1994

*Attest:*

BRUCE LEHMAN

*Attesting Officer*        *Commissioner of Patents and Trademarks*